United States Patent
Peng et al.

(10) Patent No.: US 9,520,907 B2
(45) Date of Patent: Dec. 13, 2016

(54) METHODS AND APPARATUS FOR ENVELOPE TRACKING SYSTEM

(71) Applicant: MEDIATEK INC., Hsin-Chu (TW)

(72) Inventors: Chia-Sheng Peng, Taichung (TW); Wei-Cheng Liu, Taoyuan County (TW); Sheng-Hong Yan, Tainan (TW); Paul Cheng Po Liang, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 74 days.

(21) Appl. No.: 14/181,714

(22) Filed: Feb. 16, 2014

(65) Prior Publication Data

US 2015/0236729 A1   Aug. 20, 2015

(51) Int. Cl.
*H04B 1/04* (2006.01)

(52) U.S. Cl.
CPC .......... *H04B 1/0475* (2013.01); *H04B 1/0458* (2013.01); *H04B 2001/0408* (2013.01); *H04B 2001/0425* (2013.01)

(58) Field of Classification Search
CPC ............. H04B 1/0458; H04B 2001/0425; H04B 2001/0408; H04L 25/08; H04L 27/368; H03G 3/3042
USPC ............ 455/91, 103, 104, 112, 114.1, 115.1, 126,455/127.1–127.4; 330/124 R, 129, 135
See application file for complete search history.

(56) References Cited

U.S. PATENT DOCUMENTS

| | | |
|---|---|---|
| 5,256,987 A | 10/1993 | Kibayashi |
| 5,852,630 A | 12/1998 | Langberg |
| 6,349,216 B1 | 2/2002 | Alberth, Jr. |
| 6,438,360 B1 | 8/2002 | Alberth, Jr. |
| 6,725,021 B1 | 4/2004 | Anderson |
| 7,782,134 B2 | 8/2010 | Drogi |
| 7,915,954 B2 | 3/2011 | Raghupathy |
| 8,320,850 B1 | 11/2012 | Khlat |
| 8,669,745 B2 | 3/2014 | Wimpenny |
| 8,761,698 B2* | 6/2014 | Langer ................. H04B 1/0458 455/127.1 |
| 8,781,417 B2 | 7/2014 | Blin |
| 8,829,993 B2 | 9/2014 | Briffa |
| 2003/0076168 A1 | 4/2003 | Forrester |
| 2008/0008263 A1* | 1/2008 | Keerthi ................. H03F 1/0222 375/297 |
| 2010/0233977 A1* | 9/2010 | Minnis .................. H03F 1/0211 455/127.1 |
| 2010/0321086 A1 | 12/2010 | See |

(Continued)

FOREIGN PATENT DOCUMENTS

| | | |
|---|---|---|
| DE | 198 60 097 A1 | 7/1999 |
| DE | 100 35 060 A1 | 4/2001 |

(Continued)

OTHER PUBLICATIONS

Chia-Sheng Peng et al., Title: Methods and Apparatus for Envelope Tracking System, pending U.S. Appl. No. 14/180,364, filed Feb. 14, 2014.

*Primary Examiner* — Thanh Le
(74) *Attorney, Agent, or Firm* — Optimus Patents US, LLC

(57) ABSTRACT

A communication unit comprises a radio frequency, RF, transmitter comprising: a power amplifier, PA, module; an envelope tracking system operably coupled to the PA module and arranged to variably control a supply voltage for the PA module; and a load control system operably coupled to an output of the PA module and arranged to control a power amplifier output load.

7 Claims, 13 Drawing Sheets

(56) References Cited

U.S. PATENT DOCUMENTS

| | | | |
|---|---|---|---|
| 2011/0136452 A1* | 6/2011 | Pratt | H03F 1/34 455/127.1 |
| 2012/0126893 A1* | 5/2012 | Yamanouchi | H03F 1/0244 330/135 |
| 2012/0229208 A1 | 9/2012 | Wimpenny | |
| 2013/0076418 A1 | 3/2013 | Belitzer | |

FOREIGN PATENT DOCUMENTS

| | | |
|---|---|---|
| DE | 10 2004 047 724 A1 | 5/2005 |
| DE | 10 2004 001 094 A1 | 8/2005 |

\* cited by examiner

METHODS AND APPARATUS FOR ENVELOPE TRACKING SYSTEM

BACKGROUND

The field of this invention relates to methods and apparatus for an envelope tracking system, and in particular to methods and apparatus for improving an efficiency and linearity of an envelope tracking system for a power amplifier module, for example within a radio frequency (RF) transmitter module of a wireless communication unit.

A primary focus and application of the present invention is the field of radio frequency (RF) power amplifiers capable of use in wireless telecommunication applications. Continuing pressure on the limited spectrum available for radio communication systems is forcing the development of spectrally-efficient linear modulation schemes. Since the envelopes of a number of these linear modulation schemes fluctuate, these result in the average power delivered to the antenna being significantly lower than the maximum power, leading to poor efficiency of the power amplifier. Specifically, in this field, there has been a significant amount of research effort in developing high efficiency topologies capable of providing high performances in the 'back-off' (linear) region of the power amplifier.

Linear modulation schemes require linear amplification of the modulated signal in order to minimise undesired out-of-band emissions from spectral re-growth. However, the active devices used within a typical RF amplifying device are inherently non-linear by nature. Only when a small portion of the consumed DC power is transformed into RF power, can the transfer function of the amplifying device be approximated by a straight line, i.e. as in an ideal linear amplifier case. This mode of operation provides a low efficiency of DC to RF power conversion, which is unacceptable for portable (subscriber) wireless communication units. Furthermore, the low efficiency is also recognised as being problematic for the base stations.

Additionally, the emphasis in portable (subscriber) equipment is to increase battery life. To achieve both linearity and efficiency, so called linearisation techniques are used to improve the linearity of the more efficient amplifier classes, for example class 'AB', 'B' or 'C' amplifiers. A number and variety of linearising techniques exist, which are often used in designing linear transmitters, such as Cartesian Feedback, Feed-forward, and Adaptive Pre-distortion.

Voltages at the output of the linear, e.g. Class AB, amplifier are typically set by the requirements of the final RF power amplifier (PA) device. Generally, the minimum voltage of the PA is significantly larger than that required by the output devices of the Class AB amplifier. Hence, they are not the most efficient of amplification techniques. The efficiency of the transmitter (primarily the PA) is determined by the voltage across the output devices, as well as any excess voltage across any pull-down device components due to the minimum supply voltage (Vmin) requirement of the PA.

In order to increase the bit rate used in transmit uplink communication channels, larger constellation modulation schemes, with an amplitude modulation (AM) component are being investigated and, indeed, becoming required. These modulation schemes, such as sixteen quadrature amplitude modulation (16-QAM), require linear PAs and are associated with high 'crest' factors (i.e. a degree of fluctuation) of the modulation envelope waveform. This is in contrast to the previously often-used constant envelope modulation schemes and can result in significant reduction in power efficiency and linearity.

To help overcome such efficiency and linearity issues a number of solutions have been proposed.

One known technique, as illustrated in the block diagram 100 of FIG. 1, relates to controlling the supply voltage 120 to the power amplifier 140. This technique is known as average power tracking (APT). With APT, an average power level 105 of the transmitted signal is determined and applied to an APT-Vpa mapping module 110 that determines a supply voltage (Vpa) 120 to be applied to the PA 140 based on the determined average power level. This signal is then applied to a DC-DC converter 115 and the resultant (output) voltage is applied to the Power Amplifier 140 as its supply voltage (Vpa) 120. In such APT techniques, there is always a substantially fixed load 145 for the PA 140 prior to radiating the transmit signal from an antenna (not shown). One known problem with this technique is that it operates with less efficiency at higher output power when the peak to average power ratio (PAPR) back-off is large, which is predominantly the case for more complex modulation schemes.

Another known supply voltage technique 200 is envelope tracking (ET), illustrated in FIG. 2, which relates to modulating the radio frequency (RF) power amplifier (PA) supply voltage (Vpa) 220 to match (e.g. track) the envelope of the radio frequency waveform being transmitted by the RF PA 240. Typically, ET systems control the RF PA supply voltage 220 in order to improve PA efficiency through selecting a lower supply voltage dependent upon an instantaneous envelope of the input signal, and to improve linearity by selecting a RF PA supply voltage 220 dependent upon a constant PA amplification gain. A digital (quadrature) input signal 202 is input to an RF transmitter 230, whose output provides an input power level 235 to the RF PA 240. The RF PA output 225 is typically output to a fixed load 245. Concurrently, the digital (quadrature) input signal 202 is applied to an envelope detector 204 arranged to determine a real-time envelope of the signal to be transmitted (e.g. radiated). The determined real-time envelope signal output from the envelope detector 204 is input to an envelope mapping function 210, which is arranged to determine a suitable PA supply voltage (Vpa) 220 to be applied to the PA 240 to substantially match the instantaneous real-time envelope of the signal to be transmitted. The output from the envelope mapping function 210 is input to a delay control function 212 that aligns, in time, the PA supply voltage (Vpa) 220 to the signal being passed through RF transmitter 230. The output from the delay control function 212 is input to a supply modulator 214 that provides the PA supply voltage (Vpa) 220 to be applied to the PA 240.

With ET, the instantaneous PA supply voltage (Vpa) 220 of the wireless transmitter is caused to approximately track the instantaneous envelope (ENV) of the transmitted RF signal. Thus, since the power dissipation in the PA 240 is proportional to the difference between its supply voltage and output voltage, ET may provide an increase in PA efficiency, reduced heat dissipation, improved linearity and increased maximum output power 225, whilst allowing the PA to produce the intended RF output. However, the total system efficiency is affected by supply modulator efficiency that is related to the supply modulator design, supply voltage range, bandwidth and PA loading, which typically results in ET modulator efficiency not being high enough for most applications. The envelope mapping function 210 between ENV and VPA is critical for optimum performance (efficiency, gain, and adjacent channel power (ACP)). Also critical to system performance is timing alignment between the RF signal and VPA at the PA.

A yet further known technique 300 is to combine envelope tracking (ET) with digital pre-distortion (DPD) and combine this with dynamic load modulation (DLM), as illustrated in FIG. 3. Here, control/manipulation of the input waveform/signal in the digital domain is performed in order to compensate for PA nonlinearity (AM-to-AM and AM-to-PM) effects, thereby improving PA output linearity based on prior information or measured data of the PA system. A tunable matching network (TMN), or Variable matching network (VMN), is implemented to provide a variable impedance network to PA output loading as part of DLM.

Again, a digital (quadrature) input signal 302 is input to an RF transmitter 330 via a digital pre-distortion (DPD) function 326, whose output provides an input power level 335 to the RF PA 340, driven by supply voltage Vdc 320. The RF PA output 325 is output to a tunable matching load 345. Concurrently, the digital (quadrature) input signal 302 is applied to an envelope detector 304 arranged to determine a real-time envelope of the signal to be transmitted (e.g. radiated). The determined real-time envelope signal output from the envelope detector 304 is input to an envelope mapping function 310, which is arranged to determine a suitable control voltage (Vc) 316 to be applied to the tunable matching load 345 to substantially ensure the maximum PA efficiency in the transmission. The output from the envelope mapping function 310 is input to a delay control function 312 that aligns, in time, the control voltage (Vc) 316 to the signal being output from the PA 340. The output from the delay control function 312 is input to an operational amplifier 314 that provides the control voltage (Vc) 316 to be applied to the tunable matching load 345. In this manner, PA load control may be achieved by adjusting PA output load impedance in the tunable matching load 345 to correspond to an average output power or to correspond to the envelope of input signal.

However, there is a need to use (voltage) operational amplifier 314 in order to provide higher control voltage for varactors located in the tunable matching load 345. Furthermore, this approach may induce TX signal bandwidth regrowth due to maximum-efficiency DLM mapping with DPD.

In this manner, envelope-tracking can be combined with digital pre-distortion (DPD) on the RF signal to improve ACP robustness. However, since the ET system is often a multichip implementation involving function blocks in digital baseband (BB), analogue BB, RF transceiver, power management and PA, consistent ET system performance cannot easily be guaranteed across all devices by hardware.

A yet further technique is described in US008093945 B2, titled 'Joint supply and bias modulation' (by Nujira and published in 2012), whereby the supply and bias voltages are adjusted according to instant envelope mapping.

Thus, there is a need for a more efficient and cost effective solution to the problem of improving PA efficiency and ET linearity.

SUMMARY

Accordingly, the invention seeks to mitigate, alleviate or eliminate one or more of the above mentioned disadvantages singly or in any combination.

Aspects of the invention provide a method and apparatus for calibrating an envelope tracking system for a supply voltage for a power amplifier module within a radio frequency, RF, transmitter module of a wireless communication unit.

According to a first aspect of the invention, there is provided a communication unit comprising: a radio frequency, RF, transmitter comprising: a power amplifier, PA, module; an envelope tracking system operably coupled to the PA module and arranged to variably control a supply voltage for the PA module; and a load control system operably coupled to an output of the PA module and arranged to control a power amplifier output load.

In this manner, an efficient and cost effective solution to the known problems of ET system is provided. In addition, the method and apparatus may be applied to take advantages of both ET and load control to improve PA efficiency, and can have trade-off between efficiency and linearity by selecting proper PA output load impedance.

In an optional example embodiment, the load control system may comprise at least one load controller operably coupled to a tunable matching network operably coupled to an output of the PA module and arranged to adjust a power amplifier output load. In this manner, the load controller is able to readily adjust the output impedance of the PA by tuning components within the tunable matching network, thereby improving PA efficiency.

In an optional example embodiment, the at least one load controller may perform average power based PA load control, whereby for a plurality of average output power levels of the PA module, the at least one load controller selects and sets an output load impedance for the output of the PA module. In this manner, the load controller is able to readily adjust the output impedance of the PA, for example by tuning components within the tunable matching network, based on average output levels of the PA, thereby improving PA efficiency.

In an optional example embodiment, the output load impedance for the output of the PA module may be selected and set by the at least one load controller, which may be input to or output from a look-up table. In this manner, a plurality of PA output load setting values for the load controller, e.g. load impedance values, may be stored in and subsequently extracted from, a look-up table.

In an optional example embodiment, the output load impedance for the output of the PA module may be selected and set by the at least one load controller to provide a particular gain of the PA, for a particular PA current consumption. In this manner, a plurality of PA output load setting values for the load controller, e.g. load impedance values, may be stored in and subsequently extracted from, a look-up table with an indication of a PA gain and/or a PA current consumption, in order for a controller, such as the load controller, to determine an optimum PA efficiency setting.

In an optional example embodiment, a switchable transformer-based voltage combiner may be operably coupled to a plurality of power amplifiers, PAs, of the PA module such that an output power and a load of the PA module is selectable by applying an input signal concurrently to a number of the PAs. In this optional example embodiment, a combiner controller may be operably coupled to respective inputs of the plurality of PAs by respective switches and may be arranged to switch an input signal to a number of the PAs according to an operating average output power and output load impedance for the combined PAs. In this manner, an output power value for a PA module can be more carefully selected by selecting which of a plurality of PAs to use. Furthermore, more options are made available to the controller with respect to choosing PAs exhibiting certain output loads.

In an optional example embodiment, a power controller may be arranged to select a change in supply voltage to be applied to the PA module according to a change in output load impedance. In this manner, a power controller may be able to adapt the ET system in accordance with any consequent change in output load, for example due to switching PA devices within the PA module.

In an optional example embodiment, an envelope detector may be arranged to detect an envelope of an input signal and apply an envelope indication signal to both an envelope-to-supply matching component in the ET system and an envelope-to-load matching mapping component in the load control system. In this optional example embodiment, the envelope-to-supply matching component in the ET system may be operably coupled to a supply modulator to provide a constant gain ET mapping of PA supply voltage that compensates for PA module AM/AM effects. In an optional example embodiment, a load matching delay control module may be operably coupled to the envelope-to-load matching component in the load control system whereby the load matching delay control module may adjust a timing alignment of a load control signal between a load control path of the load control system and a transmit path of the RF transmitter to align the load control to at least one instantaneous envelope of a waveform signal to be amplified. In this manner, the detection of an envelope of an input signal may facilitate two functions, for example detecting the envelope as part of an ET system as well as to facilitate envelope to load matching adjustments. Furthermore, individual delays in both paths (e.g. an ET path and a load adjustment path) may be separately adjusted to optimise time alignment of respective signals traversing the paths.

In an optional example embodiment, a coupler may be operably coupled to an impedance detector and may be arranged to receive a portion of an output signal of the PA module and provide the output signal portion to the impedance detector that is arranged to provide a PA load impedance indication to the load controller. In this manner, a real-time PA output impedance may be determined and any effect on other components within the transmitter compensated for.

In an optional example embodiment, the envelope tracking system may comprise at least one power controller for setting power levels in the envelope tracking system. In this optional example embodiment, a digital predistortion, DPD, module may be arranged to receive and distort an input transmit signal, output the distorted transmit signal to an RF transmit block to amplify and up-convert the distorted transmit signal and apply the amplified, up-converted distorted transmit signal to the PA module, wherein the power controller may be operably coupled to and may be arranged to set power levels in the RF transmit block, DPD module and envelope to supply mapping component. In this manner, it may be possible to keep or improve the PA linearity by applying a constant-gain ET system as well as incorporating DPD. In this optional example embodiment, a load controller may be operably coupled to the power controller such that the power controller sets power levels in the RF transmit block, DPD module and envelope to supply mapping component in response to a determined PA module output load.

In an optional example embodiment, an envelope to supply delay control module may be operably coupled to the envelope-to-supply matching component in the ET system whereby the envelope to supply delay control module may adjust a timing alignment between the envelope tracking path of the envelope tracking system and a transmit path of the RF transmitter to align the envelope tracking power amplifier module supply voltage to at least one instantaneous envelope of a waveform signal to be amplified.

According to a second aspect of the invention, there is provided an integrated circuit for a communication unit comprising a radio frequency, RF, transmitter comprising an envelope tracking system. The integrated circuit comprises: a power amplifier, PA, module; at least a portion of an envelope tracking system operably coupled to the PA module and arranged to variably control a supply voltage for the PA module; and at least a portion of a load control system operably coupled to an output of the PA module and arranged to control a power amplifier output load.

According to a third aspect of the invention, there is provided a method of envelope tracking in a wireless communication unit comprising a radio frequency, RF, transmitter. The method comprises: receiving an input signal with an envelope that varies with time at an input of the RF transmitter; detecting an envelope of the input signal; setting a value in an envelope to supply modulation mapping component in an envelope tracking system to set a supply voltage for a power amplifier, PA, module within the RF transmitter; receiving at least an indication of an output of the PA module; and adjusting a PA output load in response thereto.

In an optional example embodiment, adjusting a PA output load in response thereto may comprise: selecting a plurality of PA output power operating points, determining a suitable PA output impedance for each PA output power operating point in dependence on PA gain and power consumption; and adjusting a PA output load impedance in response thereto.

In an optional example embodiment, determining a suitable PA output impedance for each PA output power operating point may further comprise determining a supply voltage to be applied to the envelope to supply modulation mapping component, and a load impedance mapping to be applied to a tunable matching network.

In an optional example embodiment, setting a value in an envelope to supply mapping component may comprise one or more of the following: loading a value for an envelope mapping look-up table in an envelope mapping module, loading a value for a digital predistortion (DPD) module, loading at least one delay value in at least one of: an envelope-to-supply delay control module, an envelope-to-load matching delay control module.

According to a fourth aspect of the invention, there is provided a non-transitory computer program product comprising executable program code for envelope tracking in a wireless communication unit comprising a radio frequency, RF, transmitter, the executable program code operable for, when executed at a communication unit, performing the method of the third aspect.

According to a fifth aspect of the invention, there is provided a communication unit comprising a radio frequency, RF, transmitter comprising: a transmit path comprising: a digital predistortion, DPD, module arranged to receive and distort an input transmit signal; and an RF transmit block arranged to receive the distorted transmit signal and to amplify and up-convert the distorted transmit signal and apply the amplified, up-converted distorted transmit signal to the PA module, and a power amplifier, PA, module. An envelope tracking system comprises: an envelope detector arranged to detect an instantaneous envelope of the input transmit signal, an envelope to supply mapping component arranged to set a supply voltage level based on the detected envelope, and a supply modulator operably coupled to a supply of the PA module and arranged to variably control a supply voltage therefor; wherein the RF transmitter further comprises a power controller operably coupled and arranged to set levels within each of: the DPD module, the RF transmit block, envelope to supply mapping component.

In this manner, a power controller may be able to individually set and optimise the performance of each of a DPD, a RF transmitter circuit and an ET system, thereby concurrently improving efficiency and linearity.

In an optional example embodiment, a switchable transformer-based voltage combiner may be operably coupled to a plurality of power amplifiers, PAs, of the PA module such that an output power of the PA module may be selectable by applying the amplified, up-converted distorted transmit signal concurrently to a number of the PAs.

In an optional example embodiment, a combiner controller may be operably coupled to respective inputs of the plurality of PAs by respective switches and arranged to switch the amplified, up-converted distorted transmit signal to a number of the PAs according to an operating average output power for the combined PAs.

In an optional example embodiment, a coupler may be operably coupled to an impedance detector and may be arranged to receive a portion of an output signal of the PA module and provide the output signal portion to the impedance detector that is arranged to provide a PA output impedance indication to the power controller, wherein the power controller sets levels within each of: the DPD module, the RF transmit block, envelope to supply mapping component based on the PA output impedance indication.

In an optional example embodiment, an envelope to supply delay control module may be operably coupled to the envelope-to-supply matching component in the ET system whereby the envelope to supply delay control module may adjust a timing alignment between the envelope tracking path of the envelope tracking system and a transmit path of the RF transmitter to align the envelope tracking power amplifier module supply voltage to at least one instantaneous envelope of a waveform signal to be amplified.

According to a sixth aspect of the invention, there is provided an integrated circuit for a communication unit comprising a radio frequency, RF, transmitter comprising an envelope tracking system. The integrated circuit comprises a transmit path comprising: a digital predistortion, DPD, module arranged to receive and distort an input transmit signal; and an RF transmit block arranged to receive the distorted transmit signal and to amplify and up-convert the distorted transmit signal and apply the amplified, up-converted distorted transmit signal to the PA module, and a power amplifier, PA, module. An envelope tracking system comprises: an envelope detector arranged to detect an instantaneous envelope of the input transmit signal, an envelope to supply mapping component arranged to set a supply voltage level based on the detected envelope, and a supply modulator operably coupled to a supply of the PA module and arranged to variably control a supply voltage therefor; wherein the RF transmitter further comprises a power controller operably coupled and arranged to set levels within each of: the DPD module, the RF transmit block, envelope to supply mapping component.

According to a seventh aspect of the invention, there is provided a method of envelope tracking in a wireless communication unit comprising a radio frequency, RF, transmitter having a power amplifier, PA, module. The method comprises: determining a transmit output power of the PA module; and setting levels within each of: a digital predistortion, DPD, module arranged to receive and distort an input transmit signal; an RF transmit block arranged to receive the distorted transmit signal and to amplify and up-convert the distorted transmit signal and apply the amplified, up-converted distorted transmit signal to the PA module; and an envelope to supply mapping component of an envelope tracking system.

According to an eighth aspect of the invention, there is provided a non-transitory computer program product comprising executable program code for envelope tracking in a wireless communication unit comprising a radio frequency, RF, transmitter, the executable program code operable for, when executed at a communication unit, performing the method of the seventh aspect.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Further details, aspects and embodiments of the invention will be described, byway of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Examples of the invention will be described in terms of one or more integrated circuits for use in a wireless communication unit, such as user equipment in third generation partnership project (3GPP™) parlance. However, it will be appreciated by a skilled artisan that the inventive concept herein described may be embodied in any type of integrated circuit, wireless communication unit or wireless transmitter that comprises or forms a part of an envelope tracking system. Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Examples of the invention will be described in terms of an ET architecture that employs a DPD in combination with one or more of: average-power-based PA load control, a transformer-based voltage combiner, envelope-based PA load modulation (DLM). PA efficiency may be improved in various architectures whereby the output impedance is changed in addition to, and independent of, the supply voltage. In this manner, the proposed solutions may provide improved consideration of efficiency and linearity by taking ET and DPD with PA load control. PA efficiency may be improved by tuning PA output impedance, with a potential loss of linearity (introduced by larger AM/AM and AM/PM distortion) addressed by the DPD. In the case of several PAs connected to a transformer-based voltage combiner, the output power may be adjusted by switching the PA combination and thus the output impedance of each PA changes as well.

Figure 4:
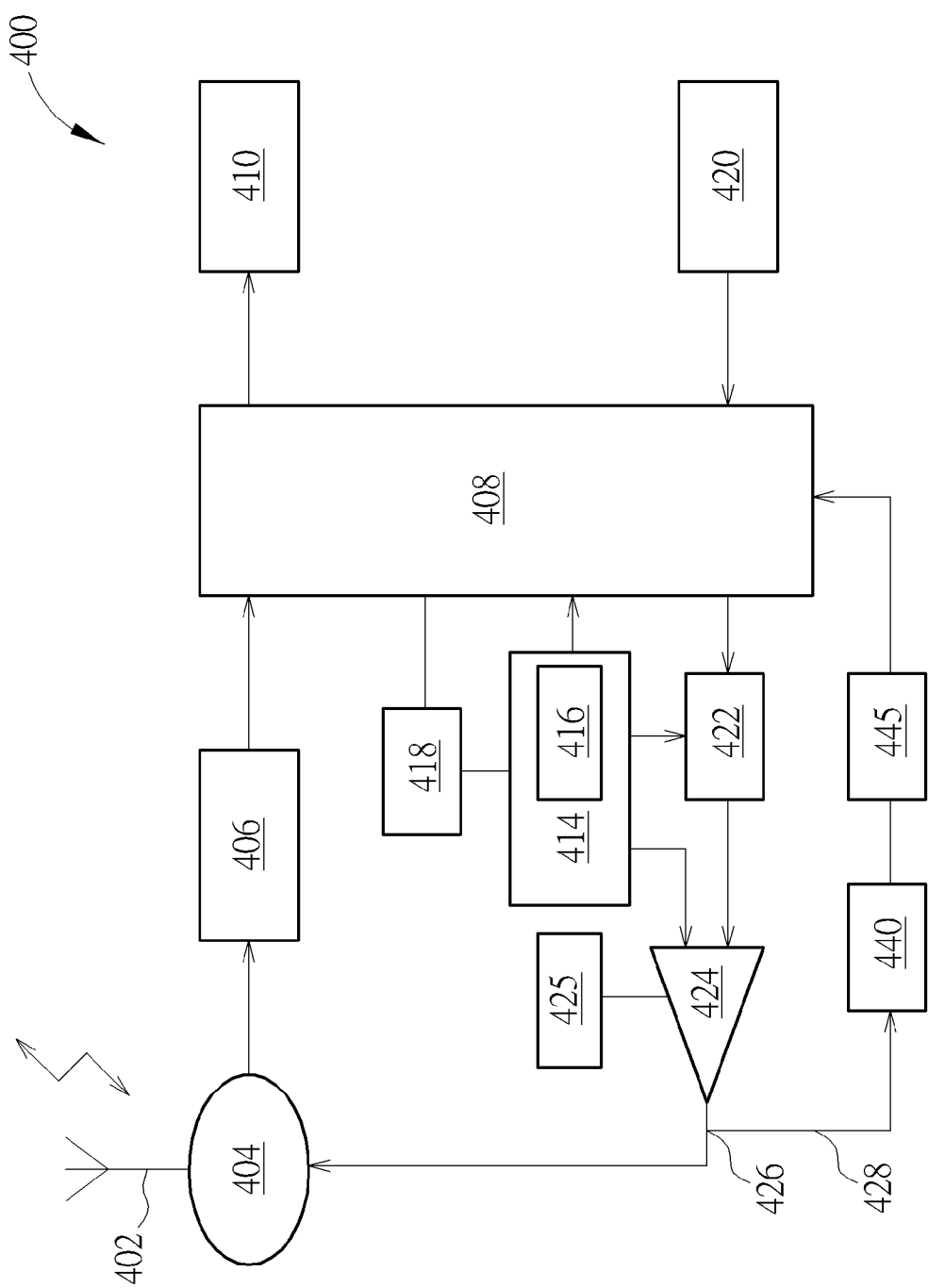
FIG. 4 illustrates a simplified generic block diagram of an example of a communication unit.

Referring first to FIG. 4, a block diagram of a wireless communication unit (sometimes referred to as a mobile subscriber unit (MS) in the context of cellular communications or a user equipment (UE) in terms of a $3^{rd}$ generation partnership project (3GPP™) communication system) is shown, in accordance with one example embodiment of the invention. The wireless communication unit 400 contains an antenna 402 preferably coupled to a duplex filter or antenna switch 404 that provides isolation between receive and transmit chains within the wireless communication unit 400.

The receiver chain 410, as known in the art, includes receiver front-end circuitry 406 (effectively providing reception, filtering and intermediate or base-band frequency conversion). The front-end circuitry 406 is coupled to a signal processing function 408. An output from the signal processing function 408 is provided to a suitable user interface 420, which may encompass a screen or flat panel display. A controller 414 maintains overall subscriber unit control and is coupled to the receiver front-end circuitry 406 and the signal processing function 408 (generally realised by a digital signal processor (DSP)). The controller 414 is also coupled to a memory device 416 that selectively stores various operating regimes, such as decoding/encoding functions, synchronisation patterns, code sequences, and the like.

In accordance with examples of the invention, the memory device 416 stores modulation data, and power supply data for use in supply voltage control to track the envelope of the radio frequency waveform to be output by the wireless communication unit 400. Furthermore, a timer 418 is operably coupled to the controller 414 to control the timing of operations (transmission or reception of time-dependent signals and in a transmit sense the time domain variation of the PA supply voltage within the wireless communication unit 400).

As regards the transmit chain, this essentially includes the user interface 420, which may encompass a keypad or touch screen, coupled in series via signal processing function 408 to transmitter/modulation circuitry 422. The transmitter/modulation circuitry 422 processes input signals for transmission and modulates and up-converts these signals to a radio frequency (RF) signal for amplifying in the power amplifier module or integrated circuit 424. RF signals amplified by the PA module or PA integrated circuit 424 are passed to the antenna 402. The transmitter/modulation circuitry 422, power amplifier 424 and PA supply voltage modulator 425 are each operationally responsive to the controller 414, with the PA supply voltage modulator 425 additionally responding to a reproduction of the envelope modulated waveform from the transmitter/modulation circuitry 422. In this manner, a PA supply voltage modulator 425 is arranged to modulate the supply voltage to the PA 424 in accordance with the envelope modulated waveform, thereby performing envelope tracking modulation of the supply voltage provided to the PA 424. A coupler 426 routes signals 428 output from the PA 424 back to the signal processing function 408 via down-converter 440 and feedback signal determination function 445.

A signal processor function in the transmit chain may be implemented as distinct from the signal processing function 408 in the receive chain 410. Alternatively, a single processor may be used to implement processing of both transmit and receive signals, as shown in FIG. 4. Clearly, the various components within the wireless communication unit 400 can be realised in discrete or integrated component form, with an ultimate structure therefore being merely an application-specific or design selection.

Furthermore, in accordance with examples of the invention, the transmitter/modulation circuitry 422, together with power amplifier 424, PA supply voltage modulator 425, memory device 416, timer function 418 and controller 414 have been adapted to generate a power supply to be applied to the PA 424. For example, a power supply is generated that is suitable for a wideband linear power amplifier, and configured to track the envelope waveform applied to the PA 424.

Figure 5:
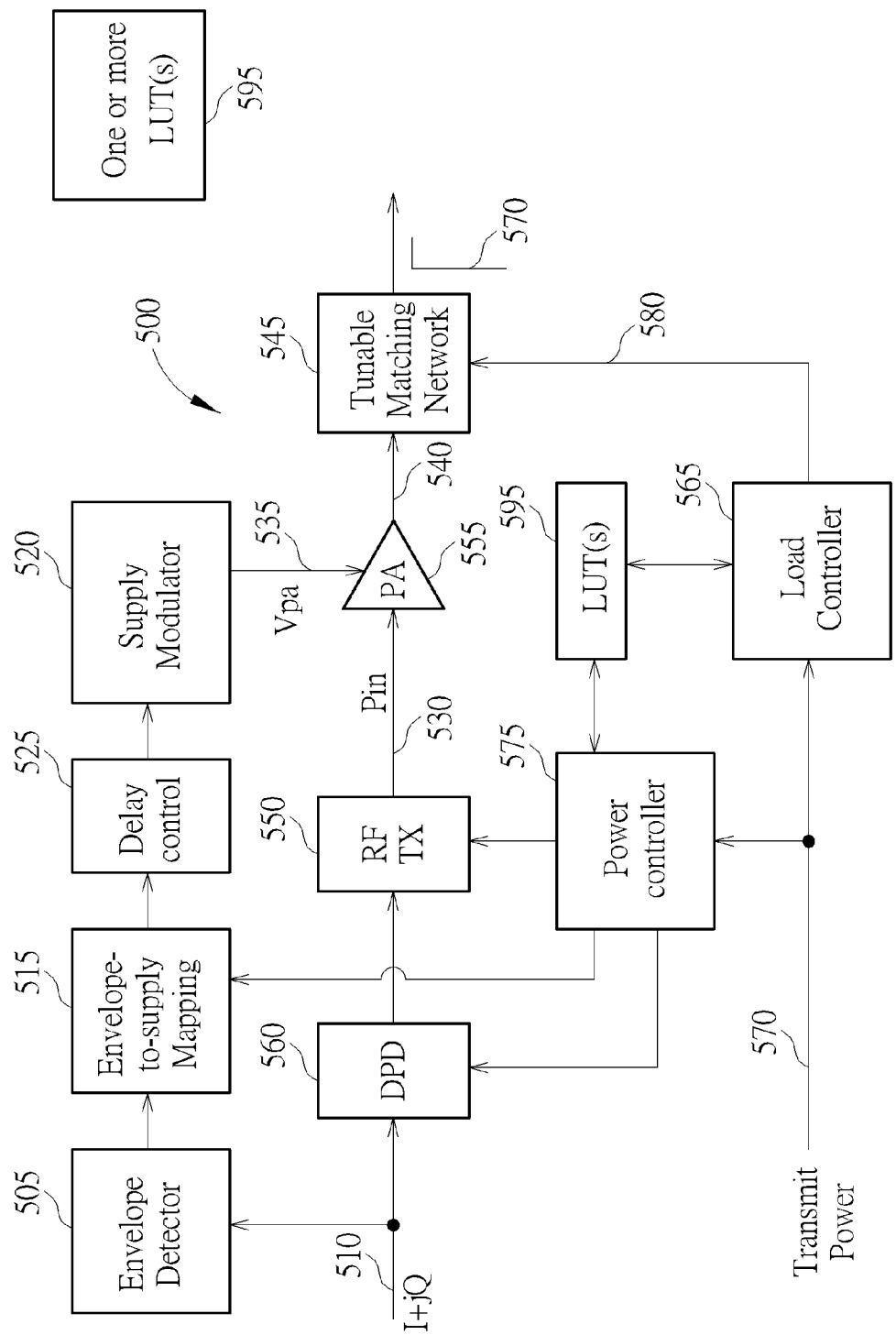
FIG. 5 illustrates a block diagram of a dynamic power amplifier load modulation circuit adapted in accordance with some examples of the invention.

Referring to FIG. 5, there is illustrated an example block diagram of a dynamic power amplifier load modulation circuit 500, adapted in accordance with some examples of the invention. In one example, the dynamic power amplifier load modulation circuit 500 may be employed in the communication unit 400 of FIG. 4. The example block diagram of a dynamic power amplifier load modulation circuit 500 supports ET as well as Load Control, with an additional option of supporting digital pre-distortion (DPD).

In some examples, the dynamic power amplifier load modulation circuit 500 may comprise an envelope detector module 505 operable to receive a digital I/Q input signal 510 and calculate an envelope value from a digital I/Q signal 510. Further, in this illustrated example, the envelope detector 505 may be operably coupled to an envelope mapping module 515, which may provide a mapping value from the calculated envelope value to a power amplifier supply voltage modulator 520 (sometimes referred to as an ET modulator), to generate a PA supply voltage (Vpa) 535 with a large current in order to create a target output power level from the PA 555. In this example, utilising envelope tracking to control the output of the PA 555 may improve the efficiency of the PA 555.

In this illustrated example, a delay control module 525 may be operably coupled between envelope mapping module 515 and supply voltage modulator 520. In this illustrated example, delay control module 525 may be operable to provide a variable delay on the envelope path in order to synchronise timing of the power amplifier input signal Pin 530 with the supply voltage input Vpa 535 provided by supply modulator 520. In one example, the delay control module 525 may also be operable to synchronise the control voltage 580 applied to tuneable matching network 545, say in a joint supply and load modulation implementation.

In order to address the linearity requirements of the transmitter, digital I/Q input signal 510 may also be input to DPD 560. DPD 560 receives a control signal to adjust the baseband (digital) signals to compensate for AM-AM and AM-PM distortion that will be introduced by PA 555. Thus, in this example, DPD receives a control signal from power controller 575, which in turn receives a sample of the transmit output signal 570.

In this example, power controller 575 is arranged to control both RF transmitter gain and envelope mapping corresponding to the average transmitted output power. The digitally pre-distorted output signals from DPD 560 are input to RF transmitter module 550, which converts the signals to analog form and up-converts the signal to an RF signal for inputting to the PA 555. In some examples, RF transmitter module 550 may further comprise a low pass filter, variable gain amplifier, mixer and frequency synthesiser (not shown). In some examples, the power controller 575 may be operable to control at least one sub-module within RF transmitter module 550. In one example, calibration of a transmit chain of the RF transmitter module 550 is performed in order to calibrate the PA 555 and analogue transmit gain functions (not shown) within RF transmitter module 550. In this example, PA 555 provides an amplified RF signal to tuneable matching network 545.

In some examples, a detection feedback path carrying transmit output signal 570 may be calibrated, in order to provide accurate power measurements. As a consequence, one or more lookup tables (LUTs) 595 may be created containing, say, for each desired output power range, corresponding baseband, transmitter/modulation circuitry, PA gain, envelope mapping, DPD, tunable matching network settings, etc. Thus, in one example, each desired PA output power, once calibrated, may be associated with its own look-up table's (LUT's) delay value, and PA output impedance.

Notably, in this example, a load controller 565 is provided to independently provide a control voltage 580 to tuneable matching network 545. The load controller 565 also receives a sample of the transmit output signal 570 and determines therefrom a suitable control voltage to control the output loading of the PA 555 corresponding to the average output power being transmitted at any instant in time.

In operation, and before sending a period of transmitted signal with a target PA output power 540, the transmitter (say controller 414 from FIG. 4, which may embody load controller 565 and power controller 575 in this example) will select the relative PA output impedance, the respective LUT for that PA output impedance, and the delay to be applied by delay control 525 according to the target PA output power 540. Once the adjustments/values are determined/selected, the controller loads the delay value in delay controller 525, loads one or more values to the envelope-to-supply LUT to the envelope mapping module 515, and (optionally) loads one or more values to the envelope-to-phase LUT (not shown) in DPD 560, and adjusts the output impedance at tuneable matching network 545.

Figure 1:
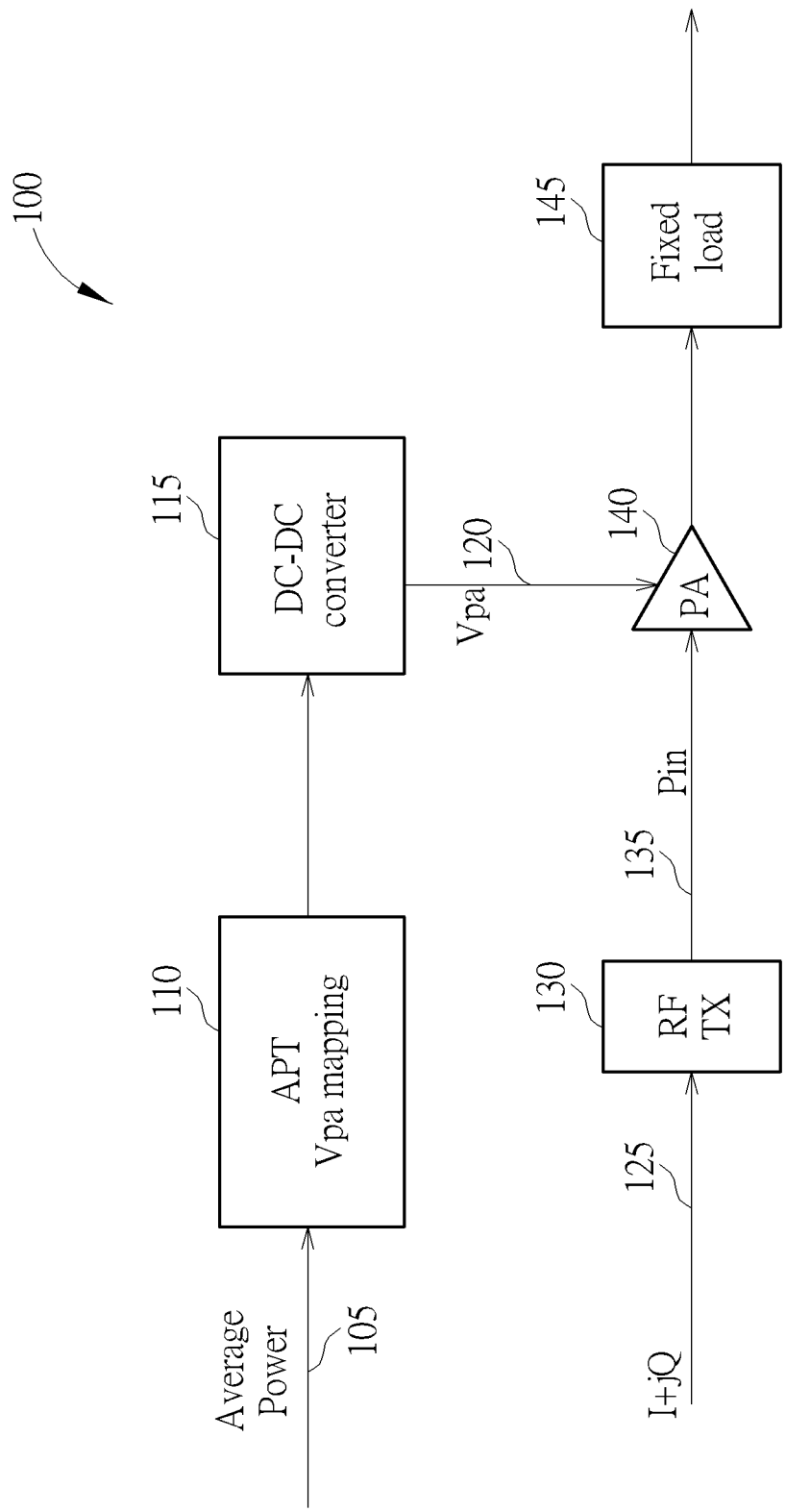
FIG. 1 illustrates a known block diagram architecture of an average power tracking (APT) technique.
Figure 2:
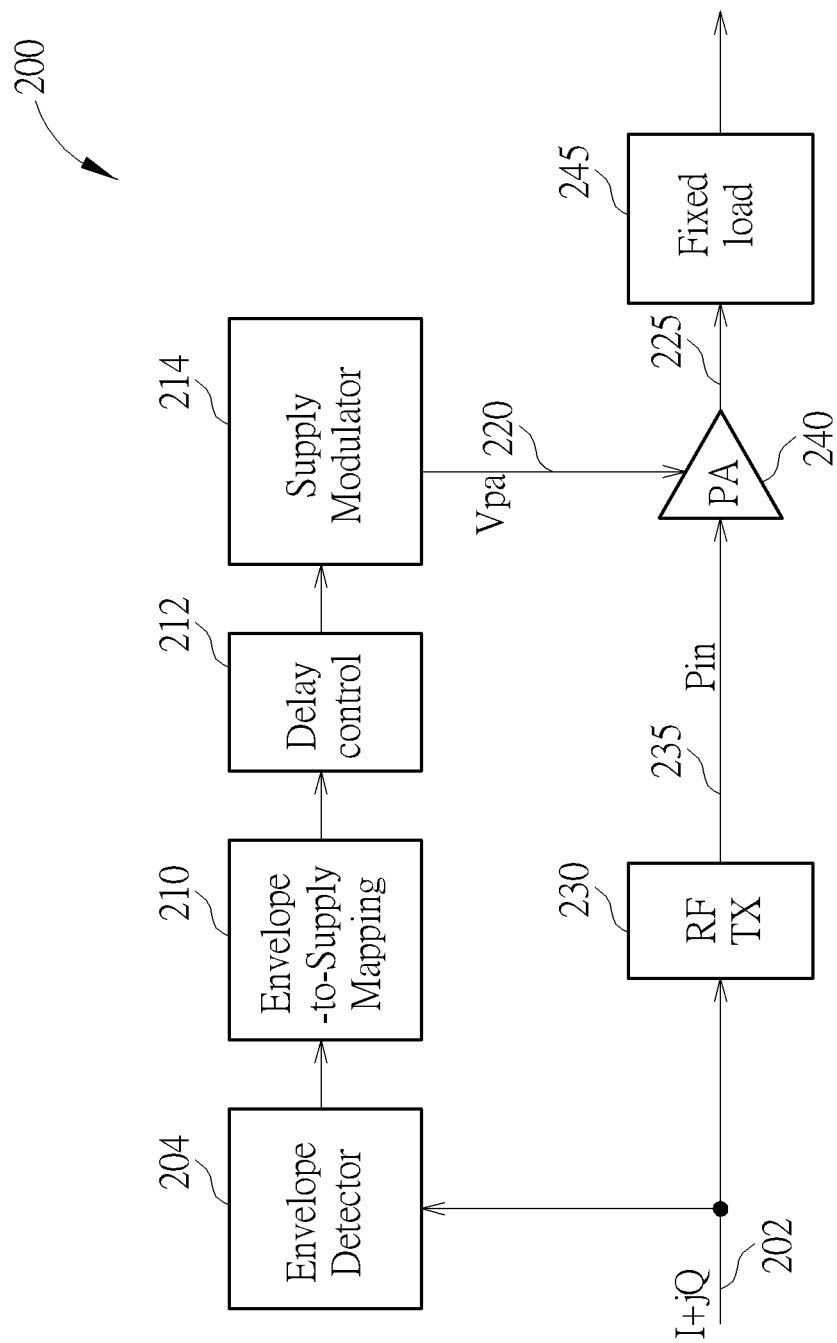
FIG. 2 illustrates a known block diagram architecture of envelope tracking (ET) technique.
Figure 3:
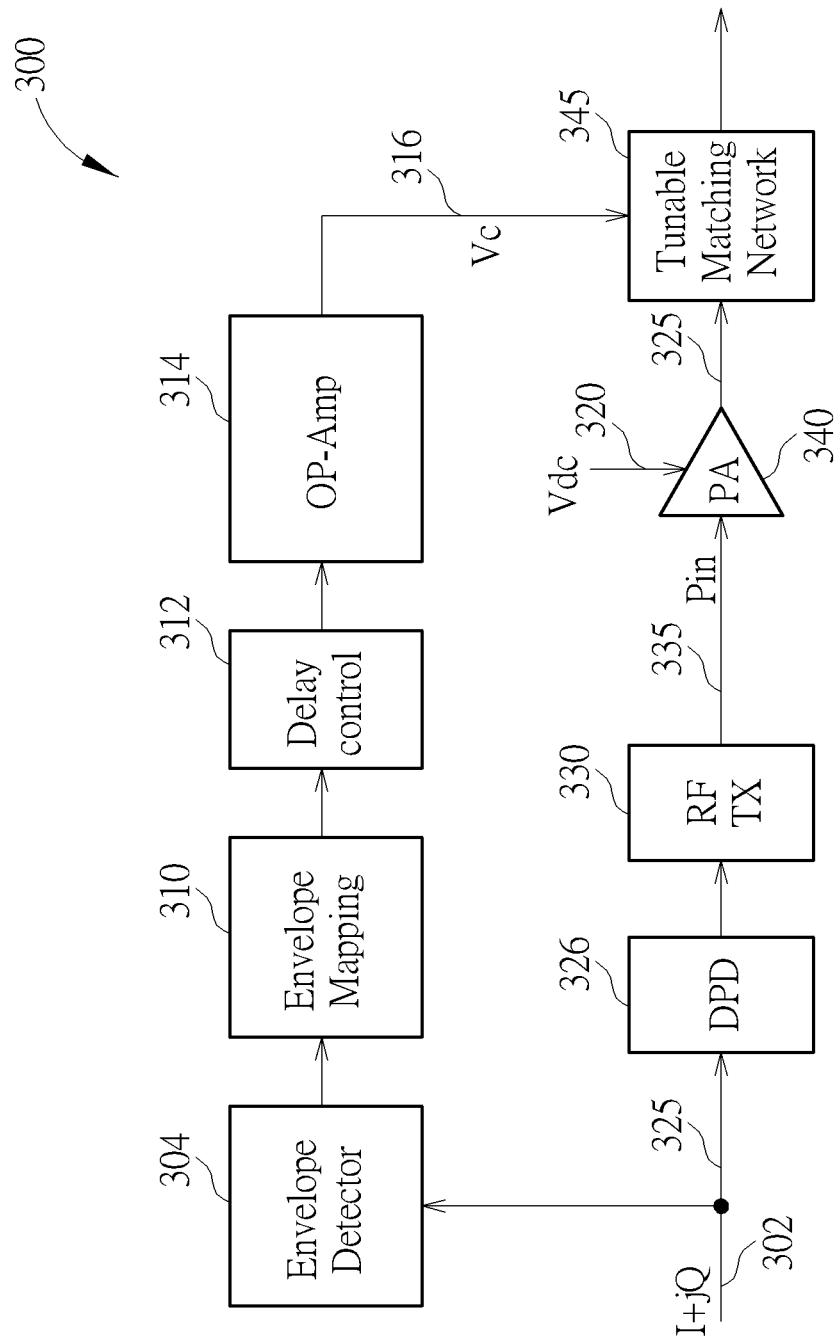
FIG. 3 illustrates a known block diagram architecture using a combination of envelope tracking (ET) with digital pre-distortion (DPD) and a dynamic load modulation (DLM) technique.

In this example, by independently and additionally providing a control voltage 580 to tuneable matching network 545 to control the load impedance, the supply modulator 520 may be able to supply a lower supply voltage to the power amplifier 555, thereby providing for a potentially improved power amplifier efficiency when compared to the architecture of FIG. 3, for example.

In various examples, it is envisaged that tuneable matching network 545 may take the form of, say, the Two-section L-type network described in Edmund Neo, et al.'s paper, "Adaptive Multi-Band Multi-Mode Power Amplifier Using Integrated Varactor-Based Tunable Matching Networks", JSSC 2008. Alternatively, in other examples, the tuneable matching network 545 may take the form of, say, an L-type network, a π-type network, a transformer coupled network, a transmission line network or a T-Type network.

According to some example embodiments of the invention, it is noteworthy that the communication unit comprises a radio frequency, RF, transmitter 500 comprising: a transmit path comprising: a digital predistortion, DPD, module 560 arranged to receive and distort an input transmit signal; and an RF transmit block 550 arranged to receive the distorted transmit signal and to amplify and up-convert the distorted transmit signal and apply the amplified, up-converted distorted transmit signal to the PA module, and a power amplifier, PA, module 555. The envelope tracking system comprises: an envelope detector 505 arranged to detect an instantaneous envelope of the input transmit signal, an envelope to supply mapping component 515 arranged to set a supply voltage level based on the detected envelope, and a supply modulator 520 operably coupled to a supply 535 of the PA module 555 and arranged to variably control a supply voltage therefor. Notably, the RF transmitter 500 further comprises a power controller 575 operably coupled and arranged to set levels within each of: the DPD module 560, the RF transmit block 550, envelope to supply mapping component 515. In this manner, the power controller 575 may be able to individually set and optimise the performance of each of a DPD, a RF transmitter circuit and an ET system, thereby concurrently improving efficiency and linearity. In some examples, the power controller 575 may receive feedback from a variety of measurements at various points in the RF transmitter 500, in order to fine tune the above setting and optimising performance of the various circuits. Some of these measurements may entail one or more of power, voltage, current, phase, latency, PA load, etc.

Figure 6:
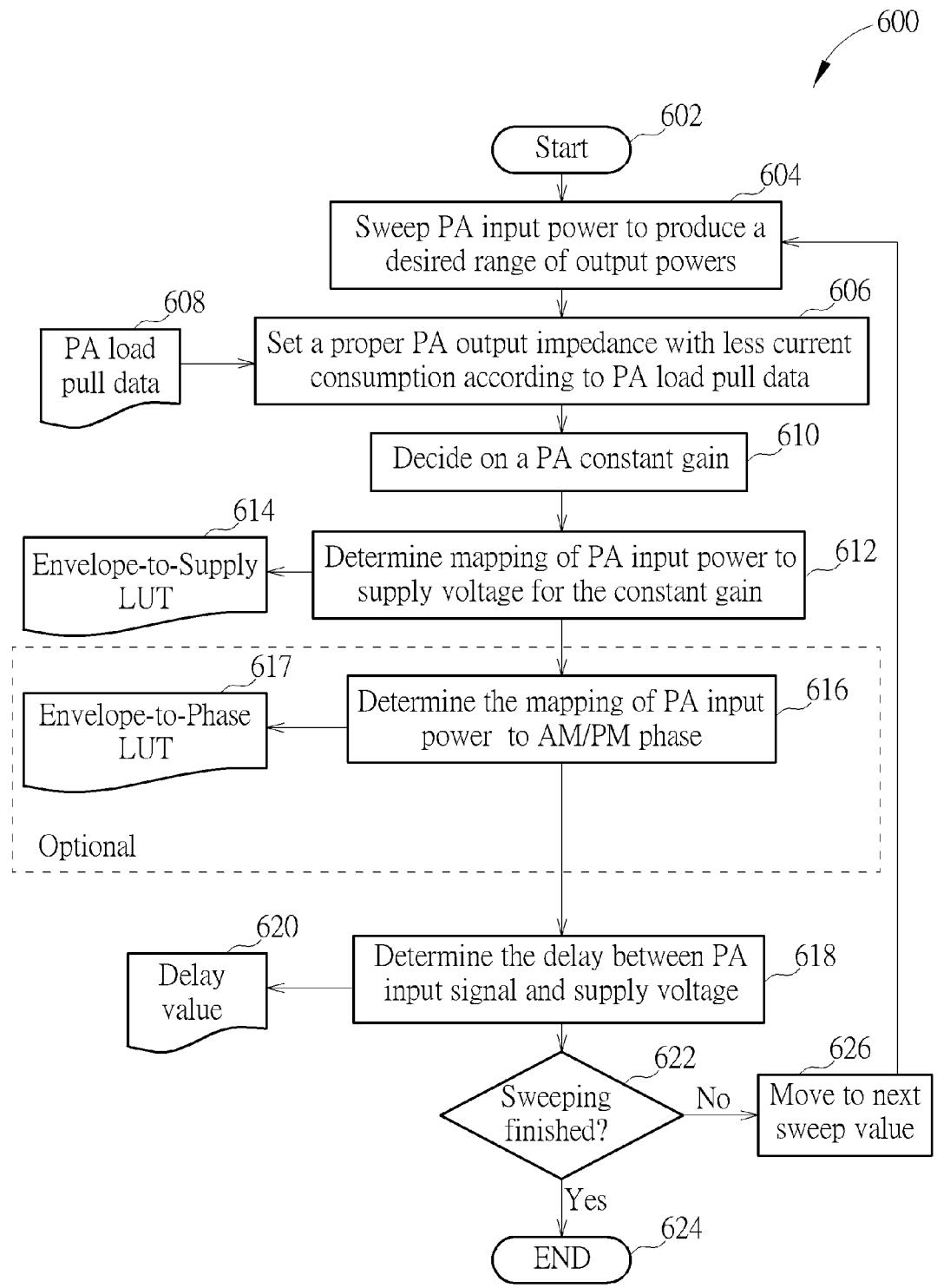
FIG. 6 illustrates an example flowchart of a method of controlling a power amplifier load modulation circuit in a calibration state, according to some examples of the invention.

FIG. 6 illustrates an example flowchart 600 of a method of controlling a power amplifier load modulation circuit in a calibration state, according to some examples of the invention. The flowchart commences at 602, and transitions to 604, where, in a calibration/test mode of operation, a power amplifier input power is swept across a number of input power levels in order to produce a range of desired and/or potential output powers.

At 606, the power amplifier output impedance is set, for example by load controller 565 of FIG. 5, based on load pull data provided in 608. In one example, the power amplifier output impedance is set with less current consumption based on the additional techniques used to optimise PA efficiency as herein described. In this example, power amplifier load pull data 608 is known in advance and may comprise a series of output power levels/values for the transmitter circuit that have been measured and stored in a look-up table or memory module, for example. In this example, the measured output power values may correspond to a series of determined PA output impedance values. For example, an output power of 27 dBm may refer to a first impedance value, an output power of 25 dBm may refer to a second impedance value, and an output power of, say, 17 dBm may refer to an $N^{th}$ impedance value.

At 610, a power amplifier constant gain is determined based on the set power amplifier output impedance. At 612, the flowchart determines a mapping of power amplifier input power to supply voltage for the determined power amplifier constant gain. At 614, the determined mapping values obtained in 612 are stored, for example, in an 'envelope-to-supply' look up table (LUT).

At 618, a time delay between the power amplifier input signal and the application of the ET supply voltage may be determined. At 620, the determined delay values obtained in 618 are stored, for example, in an 'delay compensation' look up table (LUT) before being input to a delay control module, for example, delay control module 525.

At 622, the method determines whether the power sweeping phase has been completed. If it has been completed, the method ends at 624, otherwise the method transitions back to 604 having selected a further power amplifier output power from the desired output power list at 626.

In this manner, it is possible to sweep input (and therefore output) power values for a power amplifier to set up appropriate LUTs with the required values.

In some examples, an additional optional operation 616 may be utilised if the mapping of a power amplifier input power to AM/PM phase needs to be determined. In which case, at 617, the resultant determined data may be stored in an 'envelope-to-phase' LUT. In this illustrated example, each power amplifier output in the desired list may comprise its own LUTs, delay values, and power amplifier output impedance values after calibration.

Figure 7:
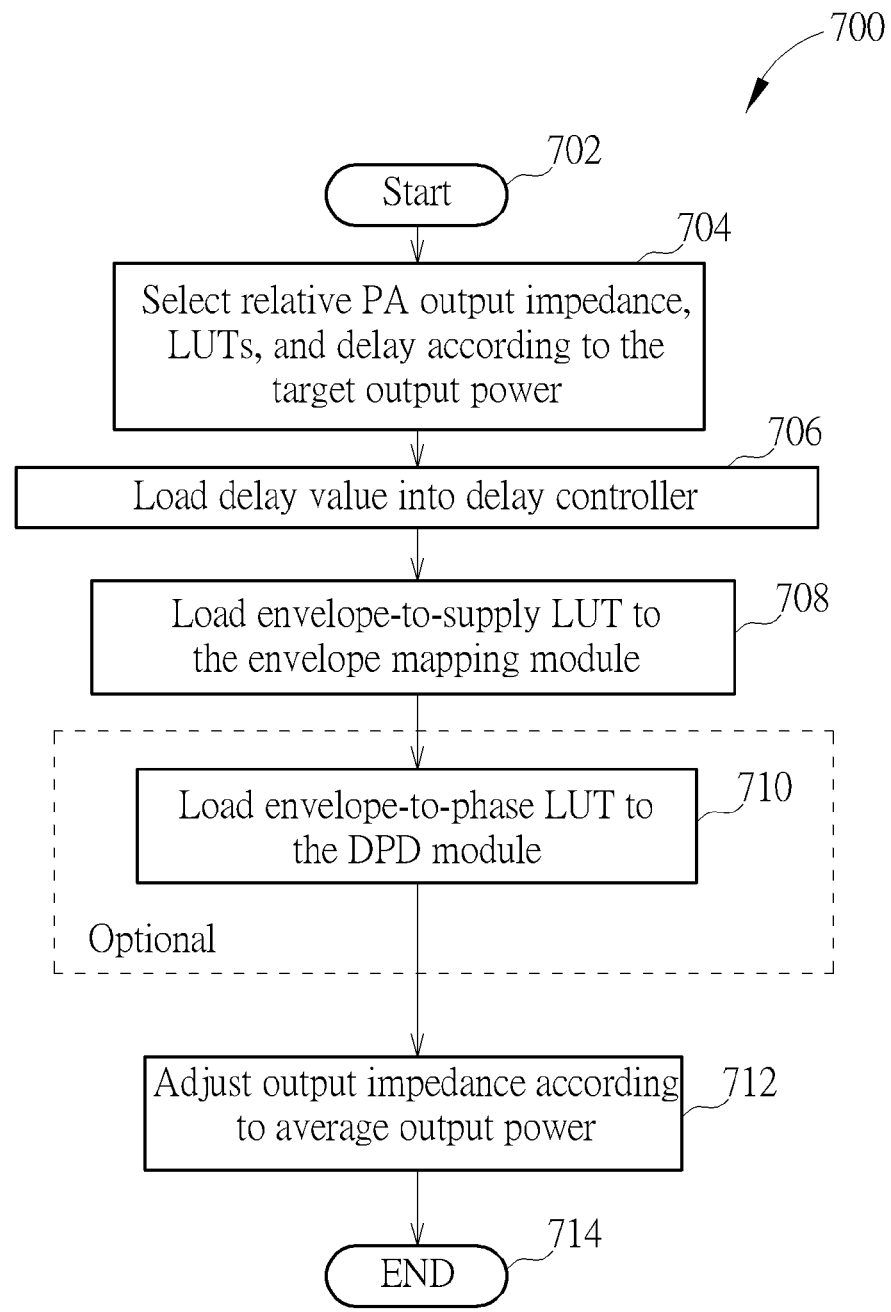
FIG. 7 illustrates an example flowchart of a method of controlling a power amplifier load modulation circuit in a transmission state, according to some examples of the invention.

Referring now to FIG. 7, there is illustrated an example flowchart 700 for controlling a power amplifier load modulation circuit in a transmission stage/mode of operation according to some example embodiments of the invention. The flowchart commences at 702 and transitions to 704, where, before sending a period of transmitted signals with a target power amplifier output power, a relative power amplifier output impedance is selected along with LUTs and delay values according to the target output power. In one example, such values may have been determined using the method of FIG. 6. At 706, a delay value, say delay value 620 calculated in 618 of FIG. 6, is loaded into a delay controller, for example delay control module 525 of FIG. 5. At 708, an 'envelope-to-supply' LUT, say 'envelope-to-supply' LUT 614 calculated in 612 of FIG. 6, is loaded into an envelope mapping module, for example envelope mapping module 515 of FIG. 5. At 712, the output impedance of the transmitter is adjusted according to the average output power, which, in some examples, may be performed by load controller 565 of FIG. 5.

In some examples, an additional optional operation 710 may be utilised if an optional digital pre-distortion module is used, for example digital pre-distortion module 560 of FIG. 5. In this case, the optional 'envelope-to-phase' LUT 617 calculated in 616 of FIG. 6 is loaded into the digital pre-distortion module, for example digital pre-distortion module 560 of FIG. 5.

Figure 8:
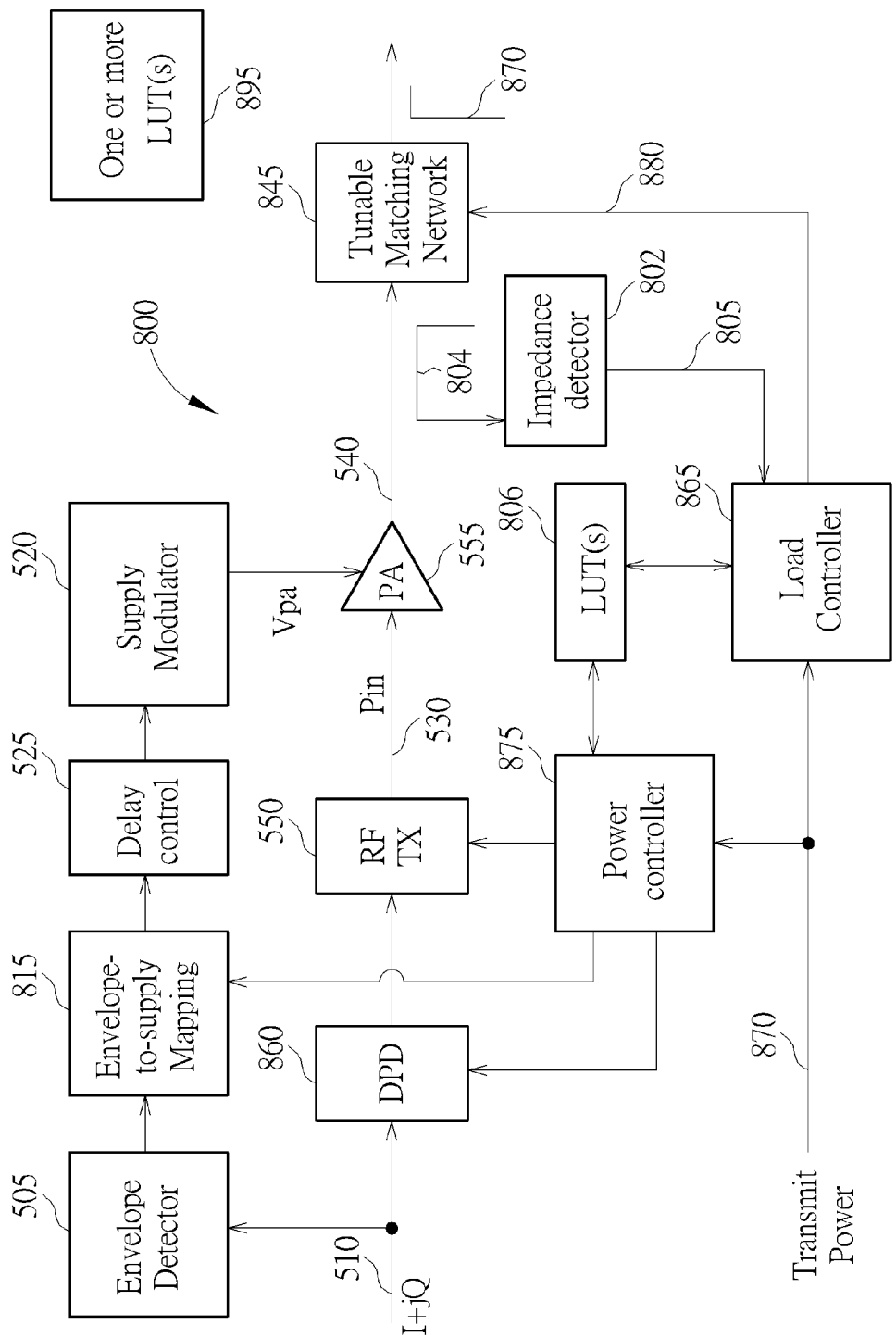
FIG. 8 illustrates a further block diagram of a dynamic power amplifier load modulation circuit, according to some examples of the invention

Referring now to FIG. 8, there is illustrated an example block diagram of a further dynamic power amplifier load modulation circuit 800 adapted to provide load control with feedback detection in accordance with some further examples of the invention. In one example, the further dynamic power amplifier load modulation circuit 800 may be employed in the communication unit 400 of FIG. 4. The illustrated example of FIG. 8 has many features in common with FIG. 5, and, thus, only additional aspects will be discussed in detail. In this example, an impedance detector 802 (which in some examples may be a component, module or a circuit) is operably coupled to load controller 865.

In this example, impedance detector 802 may be operably coupled to a coupler 804, located between the output of the PA 555 and the tunable matching network 845 and arranged to receive a portion of the transmitted signal output from the PA 555, including any signal reflection from the tunable matching network 845. In this manner, the impedance detector 802 is able to determine a load impedance value, for example based on the signal level (the signal amplitude and phase) from the PA output and any signal reflection (the signal amplitude and phase) from the tunable matching network 845, as sampled at coupler 804, and provide the calculated PA output/load impedance value 805 to load controller 865. Thus, in this example, load controller 865 may be able to utilise the calculated load impedance value 805 and determine a feedback control value 806 to be input to power controller 875. In this manner, power controller 875 is then able to adjust the control signals applied to DPD 860 and/or envelope mapping module 815, to reflect the calculated load impedance value 805 and or any change in such a value. In addition, or alternatively, load controller 865 may be able to utilise the calculated load impedance value 805 in order to determine how to adjust 880 the tunable matching network 845. In one example, the output impedance of power amplifier 555 may not only be controlled based on the average PA output power, but may also be controlled by the practical output impedance that can be attained after the tuneable matching network 845, for example, between the transmitter chain and receiver chain if there is not enough isolation.

Figure 9:
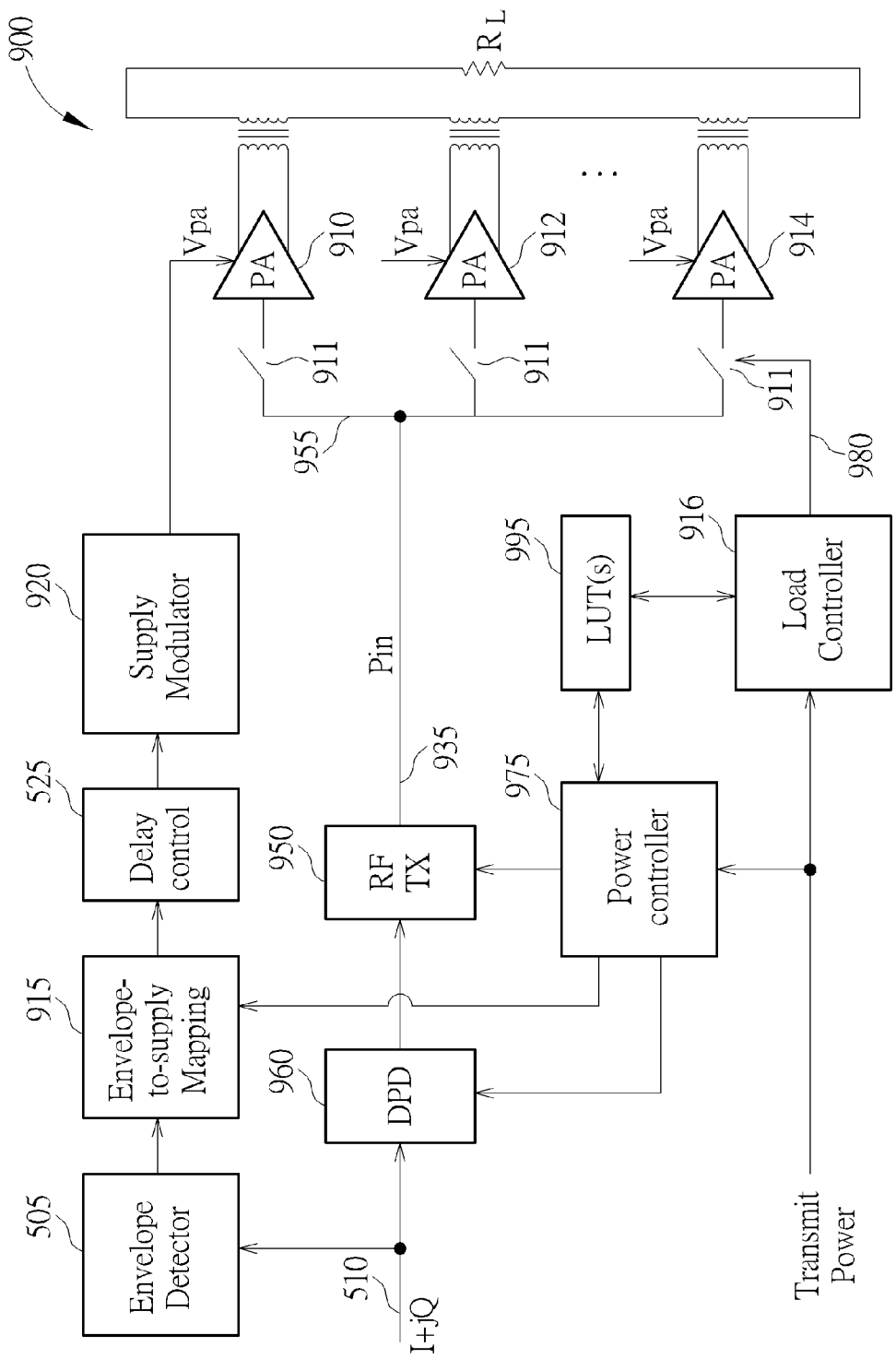
FIG. 9 illustrates a yet further block diagram of a dynamic power amplifier load modulation circuit, according to some examples of the invention.

Referring now to FIG. 9, there is illustrated an example block diagram of a yet further dynamic power amplifier load modulation circuit 900 adapted to provide at least one of: load control, gain control, envelope mapping control, digital predistortion control, with feedback detection, in accordance with some example embodiments of the invention. The illustrated example of FIG. 9 is based on ET plus a transformer-based voltage combiner. The illustrated example of FIG. 9 also has many features in common with FIG. 5 and FIG. 8, and, thus, only additional aspects will be discussed in detail.

In this example, the output from PA supply modulator module 920 may be utilised to supply a plurality of parallel-configured power amplifier modules 910, 912, 914, which may be controlled by at least one controller module 916. In this example, controller module 916 may be a combiner controller module, operable to selectively enable 980 one or more of the required power amplifier modules 910, 912, 914, thereby, potentially altering the output load impedance of the overall PA 955.

In this example, envelope tracking may be combined with a transformer-based voltage combiner arrangement to affect the output load impedance. In one example, such a transformer-based voltage combiner arrangement may be used in a CMOS digital PA (DPA).

In this example, a plurality of power amplifier modules 910, 912, 914 may be operably coupled to resistive load (RL) 918 via a series of inductively coupled coils. In some examples, the series of inductively coupled coils may be utilised with a magnetic core, for example iron, to form a series of transformers. In some examples, the series of inductively coupled coils may provide isolation between the plurality of power amplifier modules 910, 912, 914 and the resistive load (RL) 918. Thus, in this example, one or more of the plurality of power amplifier modules 910, 912, 914 may be enabled at any one time. It should be noted that the illustrated example of FIG. 9 should not be construed as limiting, and more or less than three power amplifier modules 910, 912, 914 are also envisaged.

In this example, during, say, a calibration mode of operation, yet further dynamic power amplifier load modulation circuit 900 may be operable to determine, for each average power level, which of one or more of the required power amplifier modules 910, 912, 914 to be utilised. Thereafter, during an in-use transmission mode of operation, controller module 916 is arranged to enable the selected and determined number of power amplifier modules 910, 912, 914 via switches 911. Therefore, in this example, the output load impedance of resistive load ($R_L$) 918 of the overall PA 955 may be modified.

In this example, yet further dynamic power amplifier load modulation circuit 900 may also be operable to determine envelope mapping LUT(s) 995 according to the selected power amplifier modules 910, 912, 914. Furthermore, in some examples, yet further dynamic power amplifier load modulation circuit 900 may be operable to determine mapping LUT(s) 995 of digital pre distortion module 960. Further, yet further dynamic power amplifier load modulation circuit 900 may also be operable to determine a delay between the input signal(s) of power amplifier modules 910, 912, 914 and supply voltage of supply modulator module 920 and adjust delay control function 525 accordingly.

In this example, during an in-use transmission mode of operation, yet further dynamic power amplifier load modulation circuit 900 may be operable to load the previously determined envelope mapping LUT(s) into envelope mapping module 915. Further, yet further dynamic power amplifier load modulation circuit 900 may be operable to load previously determined DPD mapping LUT (s) into DPD module 960. Further, in some examples, yet further dynamic power amplifier load modulation circuit 900 may be operable for controller module 916 to selectively switch the required power amplifier modules 910, 912, 914 into the transmit chain, according to a current average output power.

Figure 10:
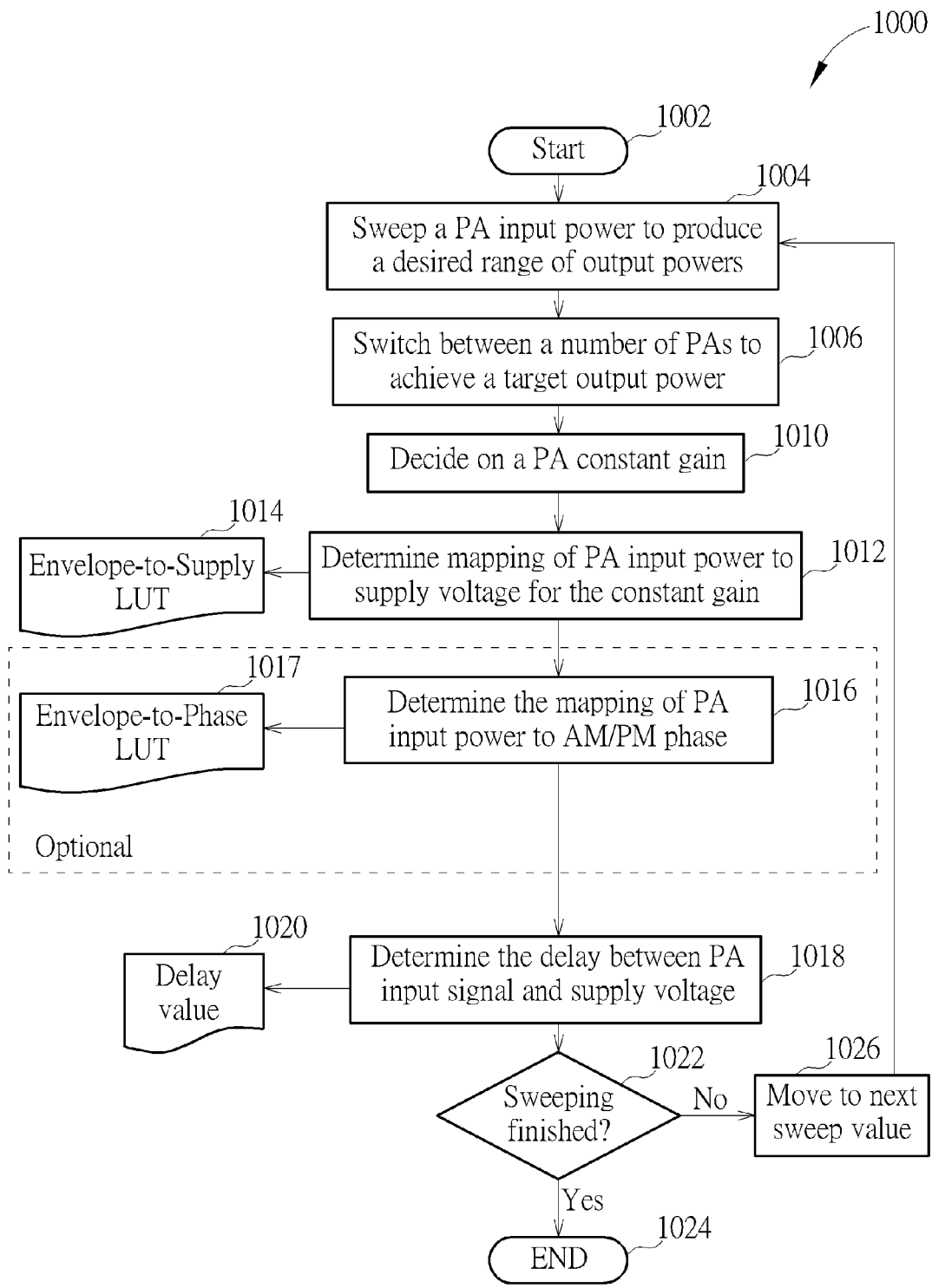
FIG. 10 illustrates a further method of controlling a power amplifier load modulation circuit, according to some examples of the invention.

Referring now to FIG. 10, there is illustrated a further example flowchart 1000 for calibrating a power amplifier load modulation circuit, according to some example embodiments of the invention. In this example, the flowchart 1000 may utilise envelope tracking with load control to improve efficiency of the power amplifier, for example utilising yet further load modulation circuit 900 illustrated in FIG. 9. The flowchart commences at 1002, and transitions to 1004 where an input signal to at least one power amplifier module output power is power swept through a range of values to produce an output power list for the at least one power amplifier module across a range of input signal levels. Thus, in some examples, a plurality of power amplifier characteristics, e.g. PA gain levels for a plurality of power amplifier modules may be obtained. At 1006, a control module, for example combiner control module 916 of FIG. 9, may be operable to enable a selected number of identified power amplifier modules to achieve a desired target output power. At 1010, a power amplifier module constant gain is determined based on the set power amplifier output impedance. At 1012, the flowchart determines a mapping of power amplifier input power to supply voltage for the previously determined power amplifier constant gain in 1010. At 1014, the determined mapping values obtained in 1012 are stored, for example, in an 'envelope-to-supply' look up table (LUT).

In some examples, an additional optional operation 1016 may be utilised if the mapping of a power amplifier input power to AM/PM phase needs to be determined. In which case, at 1017, the resultant determined data may be stored in an 'envelope-to-phase' LUT. In this illustrated example, each power amplifier output in the desired list may comprise its own LUTs, delay values, and power amplifier output impedance values after calibration At 1018, a time delay between the power amplifier input signal and the application of the ET supply voltage may be determined. At 1020, the determined delay values obtained in 1018 are stored, for example, in an 'delay compensation' look up table (LUT) before being input to a delay control module, for example, delay control module 525.

At 1022, the method determines whether the power sweeping phase has been completed. If it has been completed, the method ends at 1024, otherwise the method transitions back to 1004 having selected a further power amplifier output power from the desired output power list at 1026.

In this manner, it is possible to sweep input (and therefore output) power values across a number of power amplifier modules and across to set up appropriate LUTs with the required values.

Figure 11:
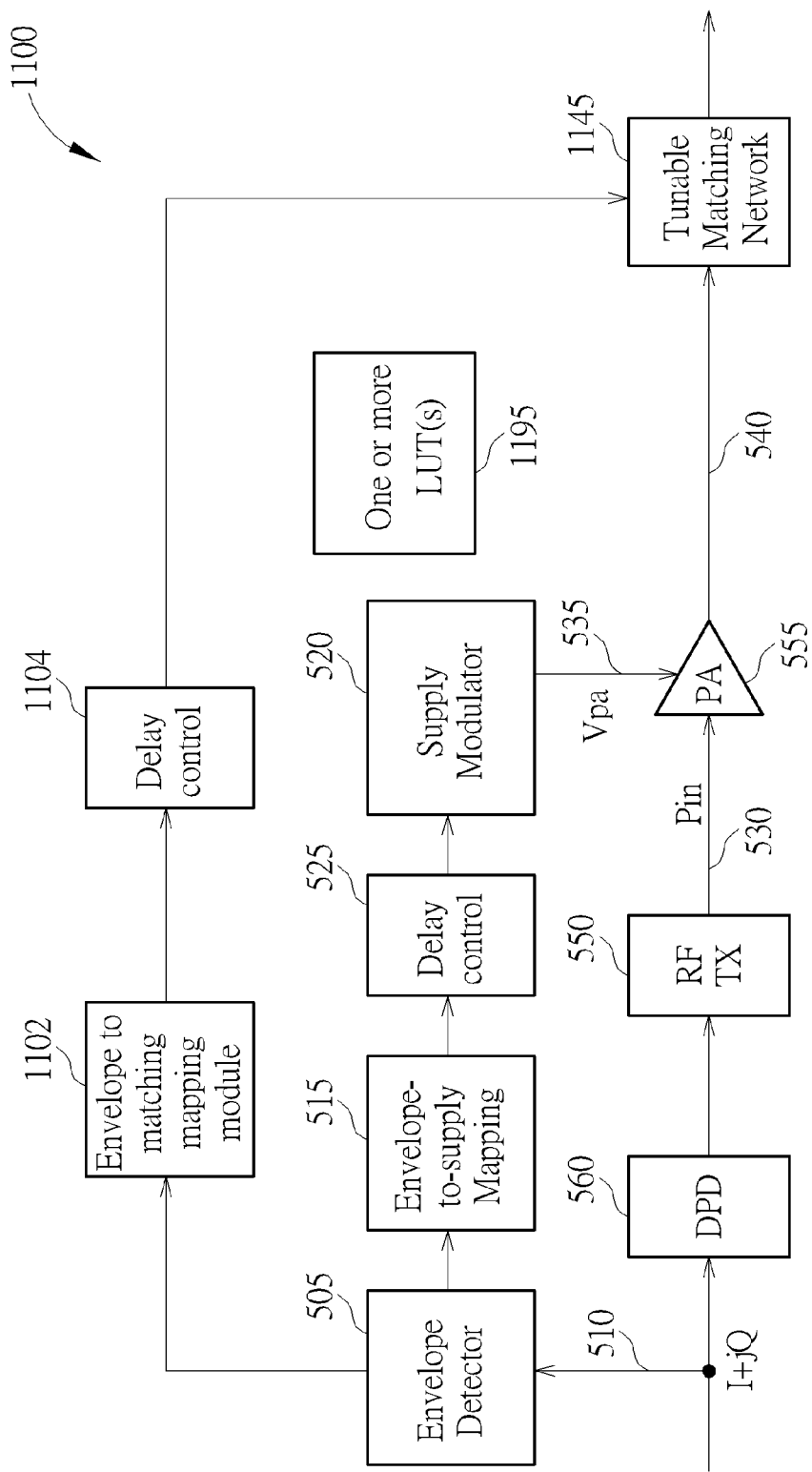
FIG. 11 illustrates a yet further block diagram of a dynamic power amplifier load modulation circuit, adapted in accordance with some examples of the invention.

Referring to FIG. 11, there is illustrated a yet further block diagram of a dynamic power amplifier load modulation circuit 1100 adapted in accordance with some example embodiments of the invention. The illustrated example of FIG. 11 has many features in common with FIG. 5 and FIG. 8, and, thus, only additional aspects will be discussed in detail. In this example, unlike FIG. 5, the transmit power is not utilised to control the parameters of the tunable matching network 1145. Instead, a detected envelope input signal 510 is input to an envelope to matching mapping module 1102, which is arranged to map a detected envelope input signal to suitable matching configuration of tunable matching network 1145. The output from the envelope to matching mapping module 1102 is a control signal that is input to further delay control module 1104, prior to re-configuring the tunable matching network. In this manner, delay control module 1104 is able to re-configure the tunable matching network 1145 in a time synchronised manner to the input signal 505 that has been processed (e.g. predistorted in DPD 560, converted to an analogue signal, frequency converted, filtered and amplified in RF transmit module 550 and PA 555) and applied to tuneable matching network 1145. Thus, the architecture of FIG. 11 may be considered as a joint/dual supply and load modulation technique for the Power Amplifier 555.

In a calibration phase, dynamic power amplifier load modulation circuit 1100 may be operable to sweep the supply voltage, load impedance and power amplifier input power, and determine at least one combination of supply voltage, load impedance, power amplifier input power and phase for each output power, for example in accordance with a maximum power amplifier efficiency. Further, in some examples, the delay between the power amplifier module input signal (s) and the supply voltage may be determined and input to the tuneable matching network 1145.

In a transmission (in-use) phase, mapped LUT values for configuring the tuneable matching network 1145 may be loaded into envelope-to-matching mapping module 1102. For example, a first set of load LUT mapping values may be applied to an envelope-to-supply mapping component, a second set of load LUT mapping values may be applied to an envelope-to-matching mapping component and/or a third set of LUT mapping values may be applied to DPD component. Further, in some examples, at least one delay LUT (not explicitly shown but part of LUTs 1195) may be coupled to both delay controllers 1104 and 525 for programming delays to be applied to signals passing therethrough. In some other examples, one or more previously determined delay values may be loaded into both delay controllers 1104 and 525.

Figure 12:
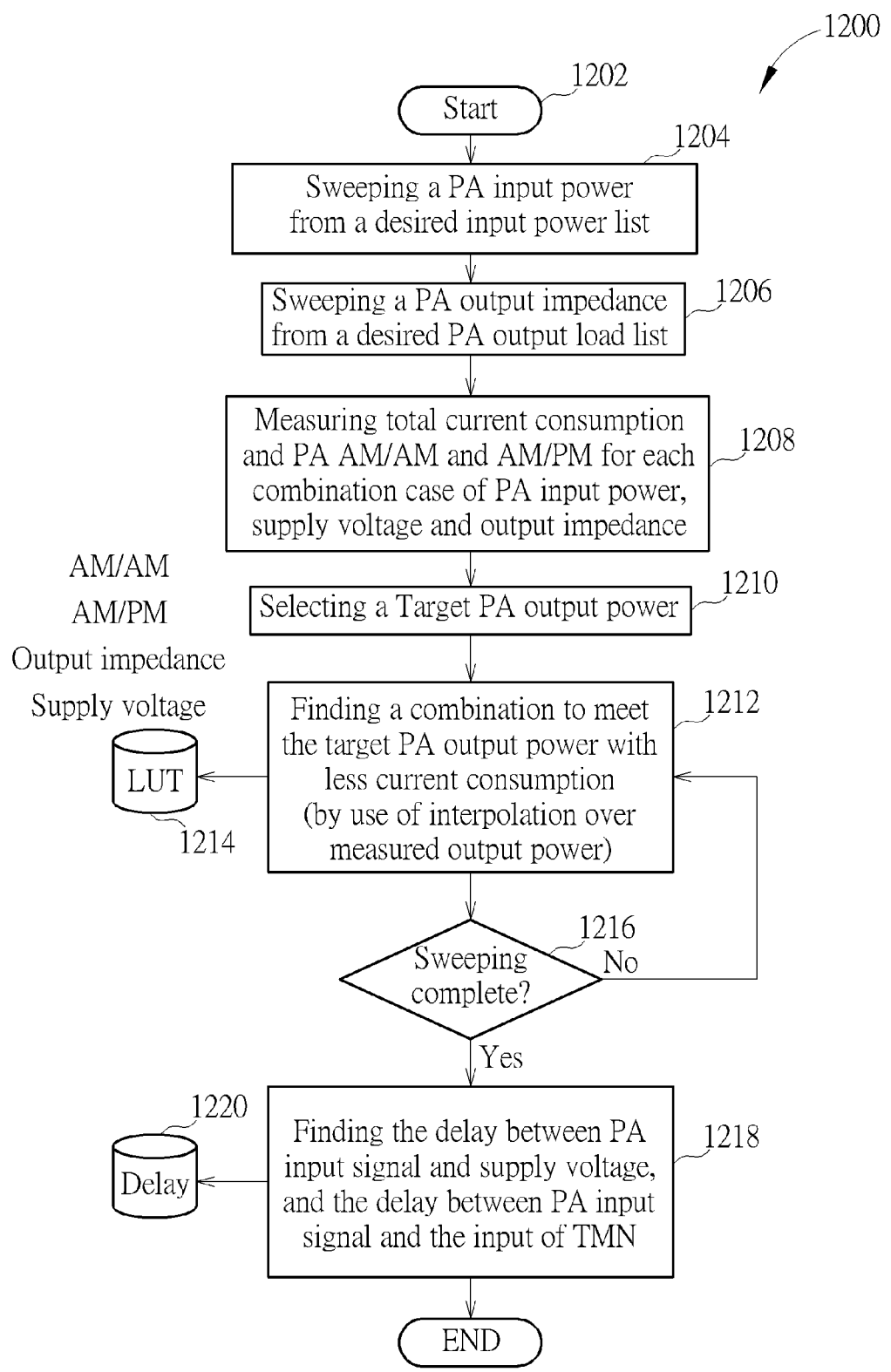
FIG. 12 illustrates a further method of controlling a power amplifier load modulation circuit according to some example embodiments of the invention.

Referring to FIG. 12, there is illustrated an example flowchart 1200 of a method of controlling a power amplifier load modulation circuit according to some example embodiments of the invention. Initially, at 1202 a power amplifier module input power is swept through the circuit from a desired input power list. At 1204, a power amplifier module supply voltage is swept through the circuit from a desired supply voltage list. At 1206, a power amplifier output impedance is also swept through the circuit from a desired power amplifier output load list. At each of these adjustments from 1202, 1204, 1206, the total current consumption is measured at 1208 along with power amplifier AM/AM and AM/PM values for each combination case of power amplifier input power, supply voltage and output impedance.

At 1210, a target power amplifier output power is selected. At 1212, interpolation may be used over the measured output power range in order to determine a combination of various values to meet the selected target power amplifier output power from 1210, for example a set of values that require less current consumption.

At 1214, the value(s) from 1212 may be stored in one or more LUTs. In some examples, the one or more LUTs may contain one or more of AM/AM, AM/PM, output impedance and supply voltage. At 1216, the flowchart determines whether (or not) the sweeping phase has been completed. If, at 1216, it is determined that the sweeping phase has not been completed, the process returns to step 1212 whereby interpolation may be used over the measured output power range in order to determine a combination of various values to meet the selected target power amplifier output power from 1210, for example a set of values that require less current consumption. Otherwise, at 1216, the process continues to step 1218 and a delay between the power amplifier input signal and supply voltage is determined, as well as the delay between the power amplifier signal and the input of the tuneable matching network. At 1220, the previously determined delay values in 1218 may therefore be stored until they are used.

In this manner, the various example embodiments described above may take advantage of both ET and load control techniques, thereby offering a more power efficient PA architecture with better linearity. In particular, different impedance values may be accommodated in the load control technique, together with employing both Vin-Vpa and Vin-PM mapping for different average output power requirements. Furthermore, Vin-Vpa and Vin-PM searching architectures and methods have been described that are advantageously not dependent on different PA output loading and output power.

Figure 13:
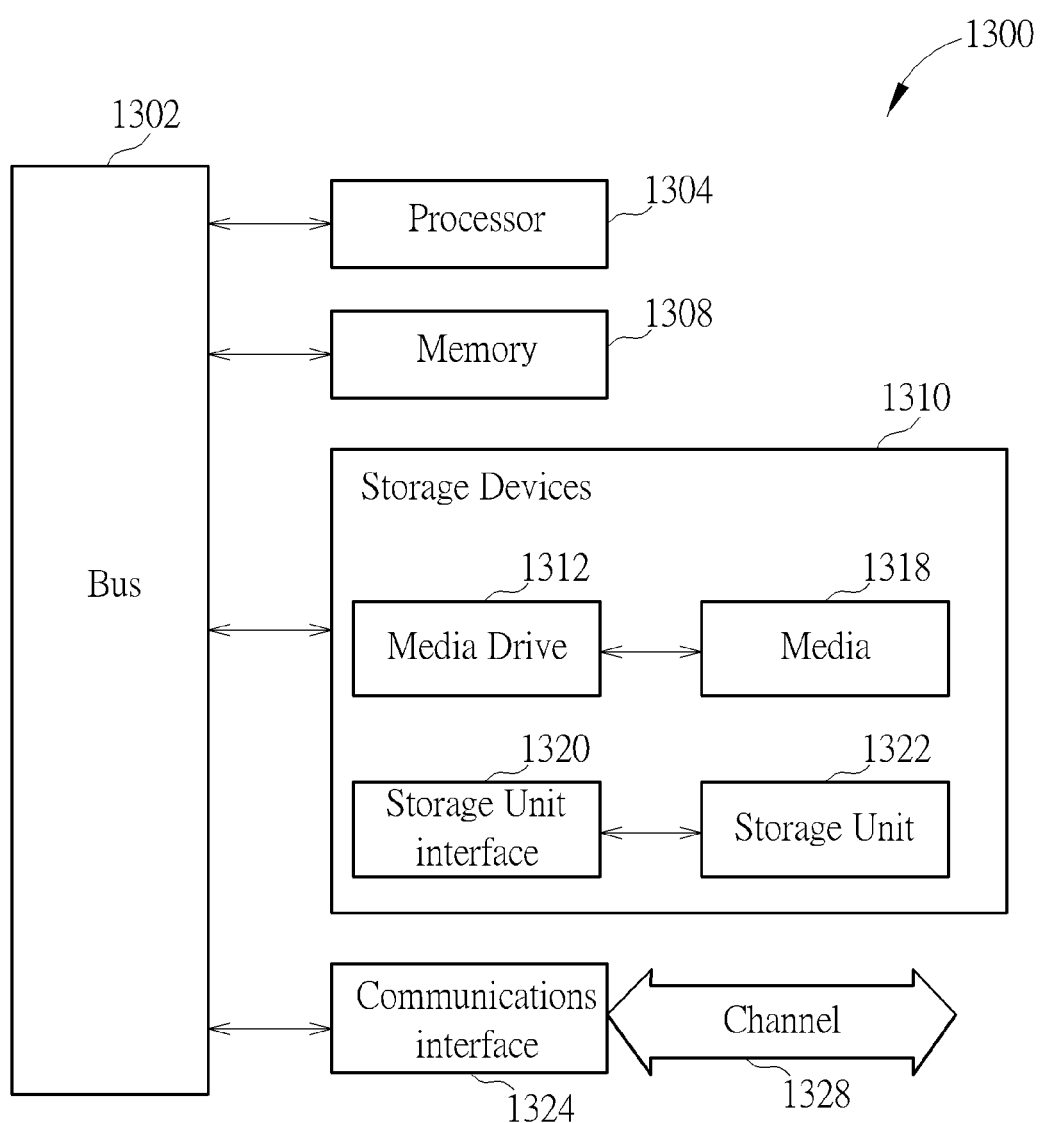
FIG. 13 illustrates a simplified example of a typical computing system that may be employed to implement signal processing functionality in embodiments of the invention.

Referring now to FIG. 13, there is illustrated a typical computing system 1300 that may be employed to implement software-controlled power control functionality in embodiments of the invention that utilize envelope tracking and load control. Computing systems of this type may be used in wireless communication units, such as base stations eNodeBs. Those skilled in the relevant art will also recognize how to implement the invention using other computer systems or architectures. For example, computing system 1300 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 1300 can include one or more processors, such as a processor 1304. Processor 1304 can be implemented using a general or special-purpose processing engine such as, for example, a microprocessor, microcontroller or other control logic. In this example, processor 1304 is connected to a bus 1302 or other communications medium.

Computing system 1300 can also include a main memory 1308, such as random access memory (RAM) or other dynamic memory, for storing information and instructions to be executed by processor 1304. Main memory 1308 also may be used for storing temporary variables or other intermediate information during execution of instructions to be executed by processor 1304. Computing system 1300 may likewise include a read only memory (ROM) or other static storage device coupled to bus 1302 for storing static information and instructions for processor 1304.

In some examples, computing system 1300 may be operable to implement various software programs to control a power amplifier load modulation circuit in a calibration state and/or control a power amplifier load modulation circuit in a transmission state.

The computing system 1300 may also include information storage system 1310, which may include, for example, a media drive 1312 and a removable storage interface 1320. The media drive 1312 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 1318 may include, for example, a hard disk, floppy disk, magnetic tape, optical disk, CD or DVD, or other fixed or removable medium that is read by and written to by media drive 1312. As these examples illustrate, the storage media 1318 may include a computer-readable storage medium having particular computer software or data stored therein.

In alternative embodiments, information storage system 1310 may include other similar components for allowing computer programs or other instructions or data to be loaded into computing system 1300. Such components may include, for example, a removable storage unit 1322 and an interface 1320, such as a program cartridge and cartridge interface, a removable memory (for example, a flash memory or other removable memory module) and memory slot, and other removable storage units 1322 and interfaces 1320 that allow software and data to be transferred from the removable storage unit 1318 to computing system 1300.

Computing system 1300 can also include a communications interface 324. Communications interface 1324 can be used to allow software and data to be transferred between computing system 1300 and external devices. Examples of communications interface 1324 can include a modem, a network interface (such as an Ethernet or other NIC card), a communications port (such as for example, a universal serial bus (USB) port), a PCMCIA slot and card, etc. Software and data transferred via communications interface 1324 are in the form of signals which can be electronic, electromagnetic, and optical or other signals capable of being received by communications interface 1324. These signals are provided to communications interface 1324 via a channel 1328. This channel 1328 may carry signals and may be implemented using a wireless medium, wire or cable, fiber optics, or other communications medium. Some examples of a channel include a phone line, a cellular phone link, an RF link, a network interface, a local or wide area network, and other communications channels.

In some further alternative embodiments, part or all of computing system 1300 may be operably coupled through a real-time communication network, for example the internet. Therefore, in some cases, the architecture of computing system 1300 may be geographically distributed over a network, with the means and ability to run the distributed parts of computing system 1300 simultaneously. In some further embodiments, computing system 1300 may be operably coupled to one or more further computing systems via a distributed computing network.

In this document, the terms 'computer program product', 'computer-readable medium' and the like may be used generally to refer to media such as, for example, memory 1308, storage device 1318, or storage unit 1322. These and other forms of computer-readable media may store one or more instructions for use by processor 1304, to cause the processor to perform specified operations. Such instructions, generally referred to as 'computer program code' (which may be grouped in the form of computer programs or other groupings), when executed, enable the computing system 1300 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 1300 using, for example, removable storage drive 1322, drive 1312 or communications interface 1324. The control logic (in this example, software instructions or computer program code), when executed by the processor 1304, causes the processor 1304 to perform the functions of the invention as described herein.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

For example, in some example embodiments, it is envisaged that the power controller and load controller may be combined within a single controller. Furthermore, in some example embodiments, although the LUTs have been described individually, thereby suggesting that they may comprise separate memory elements, it is envisaged that a number or each may form a portion of a single LUT or memory element.

Also for example, the various components/modules, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A communication unit comprising a radio frequency, RF, transmitter comprising:
    a transmit path comprising:
        a digital predistortion, DPD, module arranged to receive and distort an input transmit signal;

an RF transmit block arranged to receive the distorted transmit signal and to amplify and up-convert the distorted transmit signal and apply the amplified, up-converted distorted transmit signal to the PA module; and a power amplifier, PA, module; and an envelope tracking system comprising: an envelope detector arranged to detect an instantaneous envelope of the input transmit signal;

an envelope to supply mapping component arranged to set a supply voltage level based on the detected envelope; and a supply modulator operably coupled to a supply of the PA module and arranged to variably control a supply voltage therefor;

wherein the RF transmitter further comprises a power controller operably coupled and arranged to receive a transmit power outputted from the RF transmitter in order to set levels within each of: the DPD module, the RF transmit block, envelope to supply mapping component.

2. The communication unit of claim 1 further comprising a switchable transformer-based voltage combiner operably coupled to a plurality of power amplifiers, PAs, of the PA module such that an output power of the PA module is selectable by applying the amplified, up-converted distorted transmit signal concurrently to a number of the PAs.

3. The communication unit of claim 2 further comprising a combiner controller operably coupled to respective inputs of the plurality of PAs by respective switches and arranged to switch the amplified, up-converted distorted transmit signal to a number of the PAs according to an operating average output power for the combined PAs.

4. The communication unit of claim 1 further comprising a coupler operably coupled to an impedance detector and arranged to receive a portion of an output signal of the PA module and provide the output signal portion to the impedance detector that is arranged to provide a PA output impedance indication to the power controller, wherein the power controller sets levels within each of: the DPD module, the RF transmit block, envelope to supply mapping component based on the PA output impedance indication.

5. The communication unit of claim 1 further comprising an envelope to supply delay control module operably coupled to the envelope-to-supply matching component in the ET system whereby the envelope to supply delay control module adjusts a timing alignment between the envelope tracking path of the envelope tracking system and a transmit path of the RF transmitter to align the envelope tracking power amplifier module supply voltage to at least one instantaneous envelope of a waveform signal to be amplified.

6. The Communication unit of claim 1, where the RF transmitter is a portion of an integrated circuit.

7. A communication unit comprising a radio frequency, RF, transmitter comprising:

a digital predistortion, DPD, module arranged to receive and distort an input transmit signal, an RF transmit block arranged to receive the distorted transmit signal and to amplify and up-convert the distorted transmit signal and apply the amplified up-converted distorted transmit signal to the PA module; and a power amplifier, PA, module;

an envelope tracking system comprising:

an envelope detector arranged to detect an instantaneous envelope of the input transmit signal;

an envelope to supply mapping component arranged to set a supply voltage level based on the detected envelope; and a supply modulator operably coupled to a supply of the PA module and arranged to variably control a supply voltage therefor;

a switchable transformer-based voltage combiner operably coupled to a plurality of power amplifiers, PAs, of the PA module, wherein an output power of the PA module is selectable by applying the amplified, up-converted distorted transmit signal concurrently to a number of PAs; and a combiner controller operably coupled to respective inputs of the plurality of PAs by respective switches and arranged to switch the amplified, up-converted distorted transmit signal to a number of the PAs according to an operating arrange output power of the combined PAs;

wherein the RF transmitter further comprises a power controller operably coupled and arranged to set levels within each of: the DPD module, the RF transmit block, the envelope to supply mapping component.

* * * * *